(12) United States Patent
Quek et al.

(10) Patent No.: US 6,492,726 B1
(45) Date of Patent: Dec. 10, 2002

(54) CHIP SCALE PACKAGING WITH MULTI-LAYER FLIP CHIP ARRANGEMENT AND BALL GRID ARRAY INTERCONNECTION

(75) Inventors: Shyue Fong Quek, Petaling Jaya (MY); Ying Keung Leung, Singapore (SG); Sang Yee Loong, Singapore (SG); Ting Cheong Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 315 days.

(21) Appl. No.: 09/667,837

(22) Filed: Sep. 22, 2000

(51) Int. Cl.[7] ............................................... H01L 23/48
(52) U.S. Cl. ........................ 257/723; 257/758; 438/108
(58) Field of Search ................................. 257/697, 686, 257/723, 758; 438/108, 106

(56) References Cited

U.S. PATENT DOCUMENTS

| | | | |
|---|---|---|---|
| 5,701,233 A | * 12/1997 | Carson et al. ............... 361/735 |
| 5,744,827 A | 4/1998 | Jeong et al. ................ 257/686 |
| 5,951,804 A | 9/1999 | Kweon et al. ......... 156/244.12 |
| 6,051,886 A | 4/2000 | Fogal et al. ................. 257/777 |
| 6,051,887 A | 4/2000 | Hubbard ..................... 257/777 |
| 6,075,710 A | 6/2000 | Lau ............................ 361/760 |
| 6,365,963 B1 | * 4/2002 | Shimada ..................... 257/686 |
| 6,384,473 B1 | * 5/2002 | Peterson et al. ............ 257/680 |

* cited by examiner

*Primary Examiner*—Roy Potter
(74) *Attorney, Agent, or Firm*—George O. Saile; Rosemary L. S. Pike

(57) ABSTRACT

In accordance with the objectives of the invention a new package is provided that is provided with a cavity that is shaped such that more than one semiconductor device can in a vertical direction be mounted in the cavity of the package. The devices that are mounted inside the cavity of the package are separated by separate components of insulation, the overlying devices are electrically interconnected by horizontally positioned solder bumps and vertical interconnect plugs.

28 Claims, 3 Drawing Sheets

CHIP SCALE PACKAGING WITH MULTI-LAYER FLIP CHIP ARRANGEMENT AND BALL GRID ARRAY INTERCONNECTION

BACKGROUND OF THE INVENTION (1) Field of the Invention

The invention relates to the fabrication of integrated circuit devices, and, more particularly, to a method and package for a multi-chip module which employs stacked dies.

(2) Description of the Prior Art

Semiconductor devices have over the years been increasingly denser packaged, placing increased demands on such device package considerations as heat dissipation and input/output (I/O) capability. These increased demands have led to new device packaging concepts and approaches where, for many of these approaches, more than one device is packaged per individual packaging unit. From this has been developed a family of Chip Scale Packages (CSP) that is aimed at satisfying demands of miniaturization and multi-function capabilities by means of a high I/O count. CSP packaging techniques are still relatively expensive, requiring sophisticated and expensive equipment since they include the packaging of devices in packages that are substantially of equal size or slightly larger than the original device. The main objective for the introduction of CSP packages is the reduction in the size of the overall package. The package is designed to redistribute very fine pitch wiring from the perimeter of the die to the perimeter of the substrate carrier. CSP packages are also easy to use for burn-in of previously known good devices and are easy to test. In addition, CSP packages offer a number of advantages that relate to the manufacturing of the package such as ease of handling, assembling and rework, easy to standardize and are relatively free of internal stresses that at times can lead to device damage.

To further extend the packaging of individual devices, packages have been developed wherein more than one device can be packaged at one time on a lead frame strip. The lead frame strip not only provides mechanical support for the device but in addition provides one or more layers of interconnect lines that enable the device to be connected to surrounding circuitry, relieving I/O count requirements. Of importance to and driving most of the more complicated packaging designs are considerations of I/O count (contact ball pitch), heat dissipation, matching of thermal expansion between a mother board and host components, cost of manufacturing, ease of integration into an automated manufacturing facility, package reliability and easy adaptability of the package to additional packaging interfaces such as a Printed Circuit Board (PCB). A PCB is one of the Chip-On-Board (COB) techniques that are used to attach semiconductor die to a printed circuit board. COB techniques include flip chip attachment, wirebonding, and tape automated bonding (TAB). Flip chip attachment consists of attaching a flip chip to a printed circuit board or to another substrate. A flip chip is a semiconductor chip that has a pattern or arrays of terminals spaced around an active surface of the flip chip for face-down mounting of the flip chip to a substrate. Generally, the flip chip active surface has one of the following electrical connectors: Ball Grid Array (BGA, wherein an array of minute solder balls is disposed on the surface of the flip chip that attaches to the substrate); Slightly Larger than Integrated Circuit Carrier (SLICC) (which is similar to the BGA but has a smaller solder ball pitch and diameter than the BGA); a Pin Grid Array (PGA) (wherein an array of small pins extends substantially perpendicularly from the attachment surface of a flip chip, such that the pins conform to a specific arrangement on a printed circuit board or other substrate for attachment thereto). With the BGA or SLICC, the solder or other conductive ball arrangement on the flip chip must be a mirror image of the connecting bond pads on the printed circuit board so that precise connection can be made. The flip chip is bonded to the printed circuit board by refluxing the solder balls. The solder balls may also be replaced with a conductive polymer. With the PGA, the pin arrangement of the flip chip must be a mirror image of the recesses on the printed circuit board. After insertion, the flip chip is generally bonded by soldering the pins into place.

Glob top and underfill materials are often used to hermetically seal the flip chips on the substrate. An underfill encapsulant is generally disposed between the semiconductor chip and the printed circuit board or substrate for environmental protection and to enhance the attachment of the semiconductor die to the substrate. In certain applications, only an underfill encapsulant is used in the semiconductor assembly without protecting the back surface of the semiconductor chip. The exposure of the semiconductor chip back surface leaves the semiconductor chip susceptible to damage. Furthermore, the application of the underfill encapsulant must be closely monitored. For example, too little underfill does not protect the device sufficiently enough from outside contaminants and can give rise to a greater concentration of voids. Such voids can lead to catastrophic failure of the chip. If too much underfill is used, the underfill encapsulant can rise to cover the edges of the chip and can expand or spread out to adjacent areas of the board that do not require fill. Since the underfill encapsulant does not protect the back of the chip, an additional protective step of providing a glob top is typically used. The technique of applying the underfill encapsulant comprises dispensing the underfill encapsulant in a liquid form and allowing capillary action to draw the underfill between the die and the substrate. The underfill then solidifies upon oven curing and reinforces all electrical connections that have been made to the die. A variety of polymers can be used as underfill encapsulants, including thermosetting molding compounds such as silicones, epoxies, polyamides and parylenes. A glob of encapsulant material is generally applied to the COB assembly to surround the semiconductor chip and the substrate. Organic materials used in the glob top encapsulation are generally selected for low moisture permeability and low thermal coefficient of expansion to avoid moisture or mechanical stress. The thermal properties are however often not optimal for removing heat efficiently away from the semiconductor die or for use in high temperature areas. Furthermore, the introduction of the glob can induce detrimental stresses that can cause catastrophic failures.

For the encapsulation of semiconductor die, organic polymeric encapsulants have mostly been used such as thermoplastic, thermoset and elastomer. Also used are hermetic seals combined with heat sinks for protection of the die from environmental and thermal damage. With the many interfaces that are used for the mounting of semiconductor devices, these interfaces provide extended networks of interconnect lines that are used to expand the fine pitch I/O points of the die to an I/O pitch that is easier to handle and more reliable.

One of the more recent approaches in semiconductor device packaging has introduced a method of vertical stacking of devices in one package. In this manner, individual devices can be mounted on for instance a bonding tape, the bonding tapes with the attached die can be stacked and are further interconnected with conductive inter-connectors that intersect with the planes of the bonding tapes.

U.S. Pat. No. 6,051,886 (Fogal et al.) shows an offset die stacking arrangement.

U.S. Pat. No. 5,744,827 (Jeong et al.) shows a three-dimensional stack package including a plurality of individual semiconductor devices.

U.S. Pat. No. 6,075,710 (Lau) discloses a package in which an Integrated Circuit chip is supported on a single core, double-layer substrate as a flip chip.

U.S. Pat. No. 6,051,887 (Hubbard) provides a stacked semiconductor device with BGA.

U.S. Pat. No. 5,951,804 (Kweon et al.) provide a method for simultaneously manufacturing chip-scale packages, employing a lead frame strip having a plurality of lead frames.

SUMMARY OF THE INVENTION

A principle objective of the invention is to provide a package for flip chip devices that is of reduced bulk and weight.

Another objective of the invention is to provide a package for mounting flip chip devices that has a reduced footprint, allowing for further miniaturization of semiconductor equipment such as mobile electronic applications, communication devices and the like.

In accordance with the objectives of the invention a new package is provided that is provided with a cavity that is shaped such that more than one semiconductor device can in a vertical direction be mounted in the cavity of the package. The devices that are mounted inside the cavity of the package are separated by separate components of insulation, the overlying devices are electrically interconnected by horizontally positioned solder bumps and vertical interconnect plugs.

DESCRIPTION OF THE PREFERRED EMBODIMENTS

Figure 1:
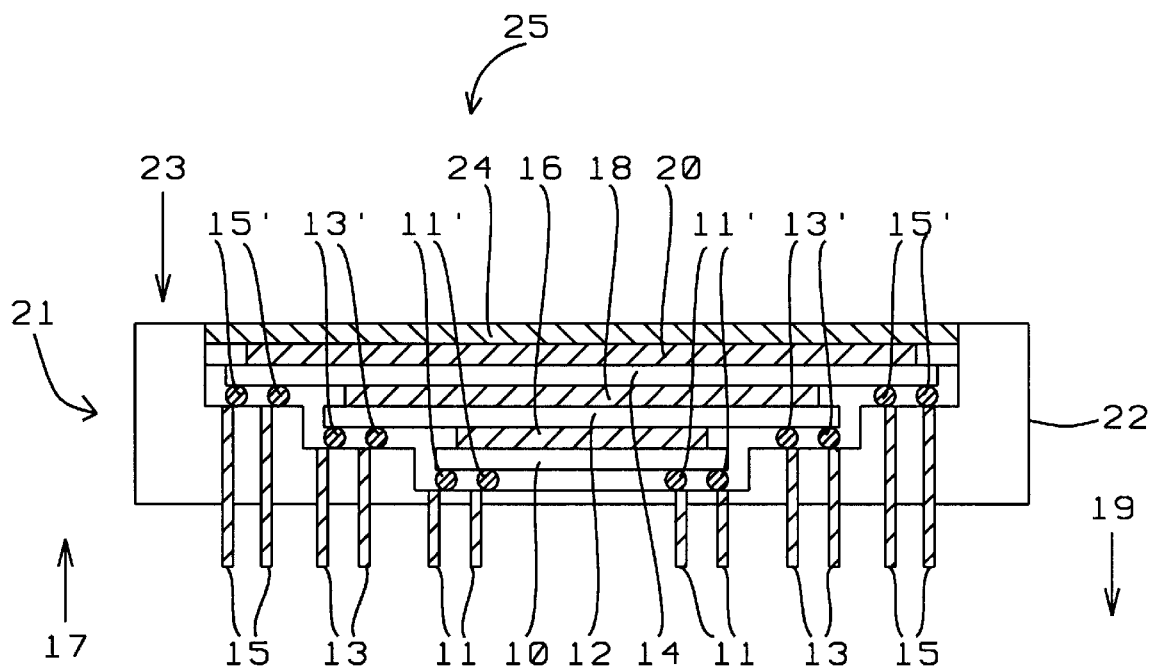
FIG. 1 shows a cross section of the package of the invention in its first embodiment.

In order to better describe the invention, further details are hereby provided that relate to some of the previously referred to methods of packaging semiconductor devices.

An offset die stacking arrangement with at least one upper level die with a width that is less than the distance separating the opposing bond sites of the underlying die is shown in U.S. Pat. No. 6,051,886 (Fogal et al.). The upper die is fixed above the lower die and rotated within a plane parallel to the lower die through an angle, which insures that none of the bonding sites of the lower die are obstructed by the upper die. The entire assembly is subjected to the wire bonding process with all of the bonds being made in the same step.

A three dimensional stack package including a plurality of individual semiconductor devices is shown in U.S. Pat. No. 5,744,827. Each individual semiconductor device comprises a semiconductor chip, a protective body for encapsulating the semiconductor chip. A lead frame and a plurality of vertical interconnection elements are attached to a back surface of the coupling lead portions (of the lead frame) and exposed from the protective body in a direction opposing the exposed top surface of the coupling lead portions. The lead frame comprises inner lead portions that are electrically interconnected to the semiconductor chip and that are included within the protective body. The lead frame further comprises outer lead portions formed as a single body with the inner lead portions, further comprises coupling lead portions that are located between the inner and outer lead portions and that have a top surface exposed upward from the protective body. An electrical interconnection of the plurality of individual semiconductor devices is accomplished by the coupling lead portions and the vertical interconnection elements, electrical interconnection of the three dimensional stack package device to an external circuit device is accomplished by the outer lead portions of a lowermost semiconductor device.

A package in which an Integrated Circuit chip is supported on a single core, double-layer substrate as a flip chip is disclosed in U.S. Pat. No. 6,075,710 (Lau). The substrate is provided with via holes to form via connections interconnecting solder bumps to a land grid array that is formed on the bottom surface of the substrate. The substrate is then surface mounted and soldered onto a printed circuit board. U.S. Pat. No. 6,075,710 further discloses a tape-substrate provided for interposing between a semiconductor chip and a printed circuit board (PCB). The tape substrate includes a bottom insulation layer and a plurality of conductive pads disposed on top of the bottom insulation layer for electrical connection to the semiconductor chip. The tape substrate further includes a plurality of PCB contact-openings, opened in an insulation layer and a plurality of PCB contact pads, each covering one of the PCB contact openings for electrical connection to circuitry on the PCB. The tape substrate further includes a plurality of connections for interconnecting conductive pads to the PCB contact-pads.

A stacked semiconductor device is formed under U.S. Pat. No. 6,051,887 with a first mounting substrate (for instance a single metal layer die tape) to which a first semiconductor die is attached, a second mounting substrate (for instance a double metal layer die tape), to which a second semiconductor die is attached. Columnar solder connections, each formed from two solder balls, are used to stack the first mounting substrate and the second mounting substrate such that the second semiconductor die is positioned between the mounting substrates.

Finally, U.S. Pat. No. 5,951,804 (Kweon et al.) provides a method for simultaneously manufacturing chip-scale packages employing a lead frame strip having a plurality of lead frames. The method includes the steps of forming the lead frame strip and the plurality of TAB tapes, and then simultaneously bonding bottom surfaces of parallel leads and tie bars of each of the respective lead frames to a top surface of the TAB tape. A plurality of chips is attached to the top surface of the TAB tape and the chips are electrically connected to contact leads formed on the TAB tape. The chips and electrical connections are then encapsulated with a molding resin to form individual packages. The individual packages are then separated from the lead frame strip.

The invention further advances the art of semiconductor device packaging by providing a package of reduced footprint, increased packaging density and reduced weight of the package. Semiconductor International reports, in an edition dated January, 2000, that Sharp Electronics claims to have developed a first three chip stacked chip-size package. This package is intended mainly for the cellular telephone market and for the terminal market of cellular telephones and information and communications equipment. The three-chip stacked CSP as developed by Sharp uses a Sharp developed technology that uses special thin silicon wafer with die and wire bonding. The three chips are mounted in a single package, the package height does not exceed 1.4 mm and can therefore replace existing two chip stacked designs. This stacking technique has also been applied in next generation compound memory products with three separate memory chips in one package. Other applications are a memory controller together with a flash ROM and a normal RAM chip, as well as new advanced system-on-chip IC devices that integrate a cellular telephone control IC flash memory and a SRAM in one package. Reliability of the package is enhanced, the shortening of the interconnections within the device results in increased frequency applications of the package.

Referring now specifically to FIG. 1, there is shown in cross section of the first embodiment of the package of the invention.

For ease of understanding the following terminology is defined as follows:

the "face" of a semiconductor device is the active surface of the semiconductor device, this is the surface of the semiconductor device in which electrical points of contact (input/output or I/O points) have been provided; the opposite surface of the semiconductor device (assuming that the cross section of the semiconductor device is a square or rectangle whereby two opposing and parallel surfaces are significantly larger that the two remaining parallel surfaces) is referred to as the backside of the semiconductor device the "bottom" (or bottom surface) of the package of the invention is the surface of the package of the invention through which points of electrical contact have been provided, and through which the semiconductor devices that are mounted in the package are electrically accessed; the opposite surface of the package of the invention (assuming that the cross section of the package of the invention is a square or rectangle whereby two opposing and parallel surfaces are significantly larger that the two remaining parallel surfaces) is the top surface "down" is the direction of the package of the invention that proceeds from the top surface of the package of the invention to the bottom surface of the package, "up" is the opposite direction.

The highlighted sub-components of the package that is shown in cross section in FIG. 1 are the following:

10, 12 and 14 are three semiconductor devices that are mounted in the package in a face-down position, that is the contact points to the three semiconductor devices 10, 12, and 14 that are provided in the surface of these devices are facing downward; stated more accurately, when looking at the semiconductor devices as they have been mounted in the package of the invention in direction "17" (the previously defined upward direction, FIG. 1) the electrical contact points that are provided in the surface of the semiconductor devices 10, 12 and 14 are visible 16, 18, and 20 are three electrical insulators and heat conductors that separate the three semiconductor devices 10, 12, and 14

11, 13, and 15 are points of electrical contact to (respectively) the three semiconductor devices 10, 12, and 14 that are provided in the bottom surface 21 of the package of the invention 11', 13' and 15' are contact balls through which the electrical points of contact in the active surface of the three semiconductor devices are connected with the contact points 11, 13, and 15

17 is the upward direction of the package of the invention 19 is the downward direction of the package of the invention 21 is the bottom surface of the package of the invention 23 is the top surface of the package of the invention 22 is the main body of the package of the invention which is an (epoxy or plastic) based construction in which semiconductor devices (such as devices 10, 12, and 14) are mounted in addition to supporting components (such as the electrical insulators and heat conductors 16, 18, and 20)

24 is a metallic cover or heat sink 25 is a cavity that is created inside the main body 22 of the package of the invention.

The method in which the package of the invention is used is discussed at this time. The main body 22 of the package of the invention is created using conventional methods of mold formation and epoxy or plastic injection into the created mold. The process that is used for the creation of the main body 22 of the package of the invention does not need to be further discussed at this time since this process uses conventional methods and technology. Where the main body 22 of the package of the invention is unique is that is must be shaped such that the above highlighted components, mainly the semiconductors devices 10, 12, and 14 and the separating electrical insulators and heat conductors 16, 18, and 20 can properly fit, as shown in cross section in FIG. 1, inside the cavity 25. In this respect the following aspects of the package of the invention are highlighted:

openings must be provided through the bottom surface 21 of the package, these openings serve for providing electrical interconnects (11, 13 and 15) to the contact balls (11', 13' and 15') of the semiconductor devices surface must be provided inside the cavity 25 of the package that are parallel with the bottom surface of the package and that can serve for the mounting of contact balls (11', 13' and 15') that serve to contact the semiconductor devices the cavity 25 of the package must be contoured such that the semiconductor devices (10, 12, and 14) and their supporting and separating mechanical interfaces (16, 18, and 20) fit within this cavity 25. These devices and their interfaces are mounted inside the cavity in a direction where the largest dimensions of the surfaces of these devices and their supporting and separating mechanical interfaces are parallel with the bottom surface 21 of the package 22 in addition, provision must be made in the cavity that allows for the mounting of a metallic cover 24 that closes the cavity 25 over its largest dimension and protects the therein mounted components from the environment in addition to serving as a means for heat exchange.

Figure 2:
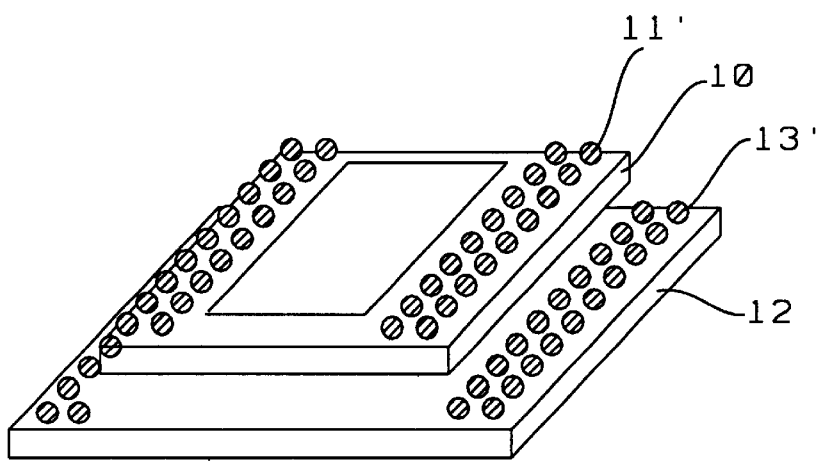
FIG. 2 shows a three dimensional view of the package of the invention in its first embodiment.

FIG. 2 shows a three dimensional view of two semiconductor devices (as examples are highlighted devices 10 and 12) and the contact balls (11' and 13') for these semiconductor devices. It is realized that the three dimensional view of FIG. 2 is, for clarity of exposure, an "upside-down" view with the smaller semiconductor device 10 overlying the larger semiconductor device 12. This is not the way in which these devices are mounted inside the cavity 25 of the package of the invention.

Figure 3:
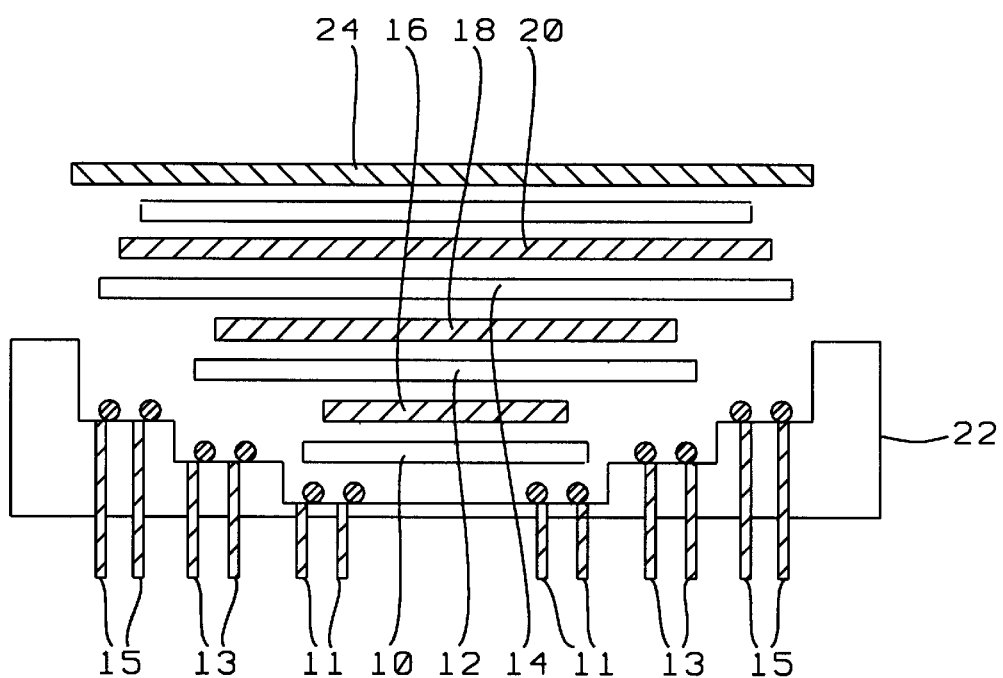
FIG. 3 shows an expanded view of the package of the invention in its first embodiment.

FIG. 3 shows an exploded view of the components of the first embodiment of the package of the invention. By "collapsing" the exploded view in a downward direction 19, the package that has been shown in cross section in FIG. 1 is obtained. All the components that are shown in FIG. 3 have previously been highlighted under FIG. 1 and do therefore not required additional description.

It is clear from the examples that have been shown in FIGS. 1 through 3 and from the accompanying descriptions of these examples that the package of the invention is not limited to mounting only three semiconductor devices. For instance, any one of the electrical insulator and heat conductors 16, 18 and 20 can be used to mount more than one semiconductor device. I/O access must in this case be provided in the interposed electrical insulator and heat conductors (electrical insulator and heat conductors that are present between the electrical insulator and heat conductors on which more than one semiconductor device are mounted and the bottom surface of the package of the invention). Where limitations in mounting multiple semiconductor devices in the package of the invention arise, these limitations are imposed not by the package of the invention but by limitations of manufacturability, electrical performance, heat dissipation, and the like. The package of the invention can be expanded to include numerous semiconductor devices and is restrained only by electrical design considerations and limitations.

In addition, the number of overlying layers of semiconductor device combined with its supporting electrical insulator and heat conductor can be extended to include more than the three layers that have been shown in FIGS. 1 through 3.

The capabilities for expansion of the package of the invention that has been described up to this time is further demonstrated and evidenced by the second embodiment of the package of the invention. The second embodiment of the package of the invention is highlighted using FIGS. 4 through 6. In the second embodiment of the package of the invention, the design and functionality of the electrical insulators and heat conductors of the package are expanded with the objective of increasing I/O pin count and the heat dissipation capabilities of the package.

Figure 4:
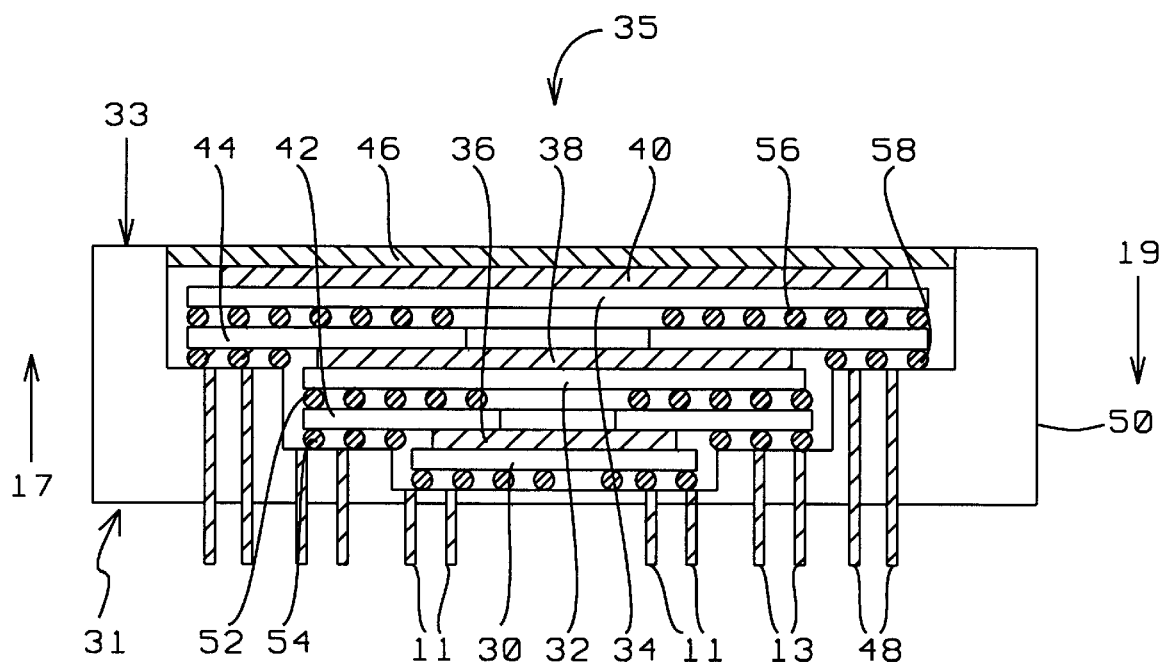
FIG. 4 shows a cross section of the package of the invention in its second embodiment.

FIG. 4 shows a cross section of the second embodiment of the package of the invention. The components of the second embodiment of the package of the invention are the following:

30, 32, and 34 are three semiconductor devices that are mounted in the package of the invention 31 is the bottom surface of the package of the second embodiment of the invention 33 is the top surface of the package of the second embodiment of the invention 35 is the cavity that has been created in the package of the invention and into which components of the package of the invention are mounted 36, 38, and 40 are electrical insulators and heat conductors; these components make direct, physical contact with the semiconductor devices that are mounted in the package 42 and 44 are lead frames that have been provided with BGA contact balls on both surfaces of the lead frames; it must be noted that a central opening (not highlighted in FIG. 4) is provided in the lead frames 42 and 44

46 is the metallic cover of heat sink 48 are contact pins to the bottom surface 31 of the package 50 is the main body of the second embodiment of the package of the invention 52 are BGA contact balls that have been provided in the top surface of the lead frame 42

54 are BGA contact balls that have been provided in the bottom surface of the lead frame 42

56 are BGA contact balls that have been provided in the top surface of the lead frame 44

58 are BGA contact balls that have been provided in the bottom surface of the lead frame 44.

Figure 5:
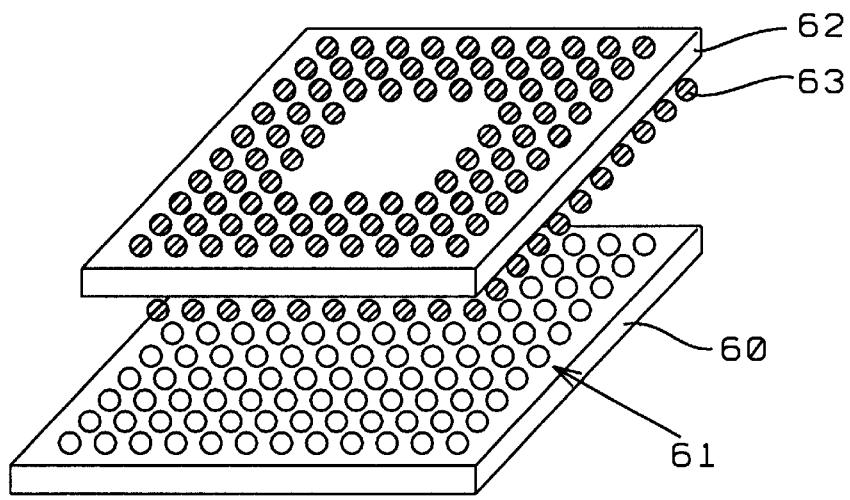
FIG. 5 shows a three dimensional view of the package of the invention in its second embodiment.

It is clear from the cross section that is shown in FIG. 4 that the functionality and potential for interconnect of the semiconductor devices that are mounted in the second embodiment package of the invention have been increased considerably by the addition of the lead frames 42 and 44, lead frames 42 and 44 are provided on both top and bottom surfaces with BGA contact balls. The package of the invention is further not limited to mounting the active surface of the semiconductor devices that are mounted in the package face down. The selection of facing the active surface of the semiconductors either downward (direction 17) or upward (direction 19) is arbitrary and can therefore be based on specific design requirements. These design requirements are, for the second embodiment of the package of the invention, most likely directed by design requirements of the lead frames 42 and 44 since these lead frames provide most of the capabilities for interconnecting overlying semiconductor devices. This is further shown in the three dimensional view that is shown in FIG. 5 where a semiconductor device 60 faces a lead frame 62 such that the active surface of chip 60 faces upwards, that is towards the lead frame 62. Points of electrical contact 61 in the active surface of the die 60 can therefore be contacted by contact balls 63 that has been provided on the surface of the lead frame 62. The three dimensional view that is shown in FIG. 5 serves as an example only, this example however does make clear that the method and components that are part of the second body of the invention provided great flexibility in designing a package.

Comments that previously have been made with respect to the aspects of the construction of the first embodiment of the package of the invention equally apply to the second embodiment of the package of the invention, to review briefly:

openings must be provided through the bottom surface of the package for providing electrical interconnects to the semiconductor devices surfaces must be provided inside the cavity of the package that are parallel with the bottom surface of the package and that can serve for the mounting of contact balls that serve to contact the semiconductor devices the cavity of the package must be contoured such that the semiconductor devices, their supporting and separating mechanical interfaces and the interfacing lead frames fit within this cavity provision must be made in the cavity for the mounting of a metallic cover.

Figure 6:
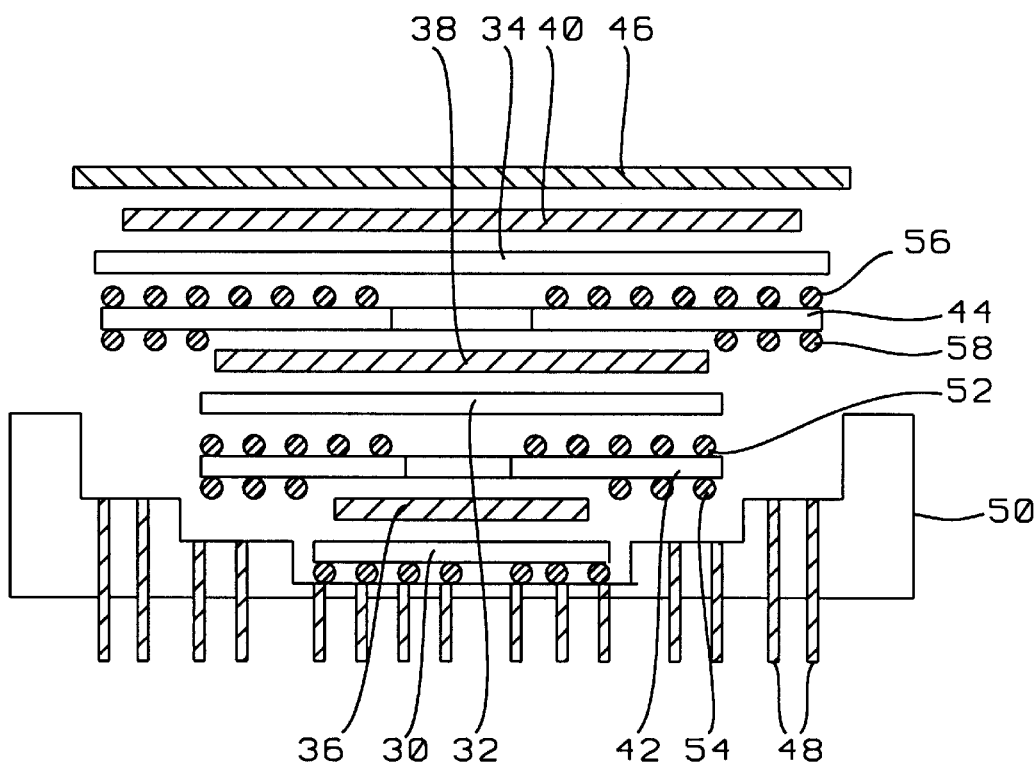
FIG. 6 shows an expanded view of the package of the invention in its second embodiment.

FIG. 6 shows, similar to FIG. 3, an exploded view of the components of the package of the invention. By "collapsing" the exploded view in a downward direction 19, the package that has been shown in cross section in FIG. 4 is obtained. All the components that are shown in FIG. 6 have previously been highlighted under FIG. 4 and do therefore not required additional description.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for mounting semiconductor devices, comprising:

providing one or more semiconductor devices, said one or more semiconductor devices having an active side having a size with semiconductor devices having been created in said active side and a backside having a size that is equal to the size of said active side, whereby the plane of said backside is parallel to the plane of said active side, whereby contact bumps have been provided in the active surface of said one or more semiconductor devices;

providing a semiconductor device package having a top surface having a size, further having a bottom surface having a size that equals the size of said top surface, said top surface and said bottom surface being in parallel planes, said package having an upward direction that proceeds from said bottom surface of said package to said top surface of said package, also having a downward direction that is opposite to said upward direction, said top surface of said package and said bottom surface of said package being interconnected by four alternatingly parallel side surfaces of said package that intersect under a ninety degree angle as observed in a cross section of a plane that is parallel with said bottom surface of said package whereby said side surfaces are further perpendicular to said bottom surface of said package when observed in a cross section of said package in a plane that is perpendicular to said side surfaces, said top surface in combination with said bottom surface and said four side surfaces enclosing said package, said package having a cavity in said top surface of said package, said cavity having an opening having a size in the plane of said top surface of said package, whereby said size of said opening is smaller than said size of said top surface of said package by a measurable amount, said cavity further having contoured sidewalls, said contoured sidewalls comprising surfaces that in an alternating sequence are perpendicular to and parallel with the plane of said bottom surface starting with a surface that is perpendicular with said bottom surface of said package when entering said cavity of said package and ending with a surface that is perpendicular to said bottom surface of said package, said surfaces in said contoured sidewalls of said cavity that are parallel with said bottom having been provided with points of electrical contact, said cavity further having a flat bottom surface that is parallel to the plane of said bottom surface of said package in addition to being in close physical proximity to said bottom surface of said package, said cavity having cross sections in one or more planes that are parallel with said plane of the bottom of said package whereby multiple cross sections of said cavity in planes that are parallel with said top surface of said package have a size, whereby said size of the surface of said cross sections when proceeding from said top surface to said bottom surface of said package is of decreasing value, said cavity having a line forming a geometric center of said cavity said line being perpendicular to said bottom surface of said package and being equidistant from each pair of parallel surfaces of said sidewalls of said package, whereby a cross section of said cavity in a plane that is parallel with the plane of said bottom surface of said package is a geometric square or rectangle with points of intersection of the diagonals of said square or rectangle coinciding with the point where said line forming a geometric center of said cavity intersects the plane of the cross section, said package having been provided with points of electrical interconnect in the bottom surface of said package, said package further having conductive plugs that connect said points of electrical interconnect provided in said surfaces inside said cavity that are parallel with said bottom surface of said cavity with said points of electrical interconnect in the bottom surface of said package;

providing one or more semiconductor supporting units that provide mechanical support for mounting said one or more semiconductor devices and that further function as electrical insulators and heat conductor units between said one or more semiconductor devices, said one or more semiconductor supporting units having a top surface having a size and bottom surface having a size, whereby the plane of said top surface is parallel to the plane of said bottom surface, whereby therefore the size of said top surface is equal to the size of said bottom surface, whereby the size of the top surface of at least one of said one or more semiconductor supporting units can be matched with the size of an active side of at least one of said one or more semiconductor devices, whereby the size of a matching semiconductor supporting unit is smaller than the size of the top surface of a matching semiconductor device by a measurable amount;

matching and joining at least one of said one or more semiconductor devices with at least one of said matching semiconductor support units in a plane that is parallel with the plane of said bottom surface of said package, whereby the size of the combined surface of said one or more matched semiconductor devices is about equal to the size of at least one semiconductor supporting unit, creating matched semiconductor device and device support units;

inserting said matched semiconductor device and device support units into said cavity, whereby the size of the surface of a cross section of the cavity is about equal to said size of the surface of said one or more semiconductor device support units, overlaying said semiconductor device support unit with a matching semiconductor device attached thereto over a surface of said contoured sidewalls of said cavity that is parallel with the surface of said bottom surface of said package, establishing points of electrical contact of said solder bumps of said one or more semiconductor devices with said contact points provided in said horizontal surfaces in said cavity of said semiconductor package, establishing electrical contact between said solder bumps provided in said one or more semiconductor devices and said conductive plugs provided in the bottom surface of said semiconductor package, completing the overlaying of said surfaces inside said cavity that are parallel with said bottom surface of said package with matched semiconductor device and device support units;

providing a metallic cover that has a top surface having a size and a bottom surface that is parallel to the plane of said top surface having a size that is equal to said size of said top surface of said metallic cover, whereby the size of said top surface of said metallic cover is about equal to the size of said top opening of said cavity in said semiconductor package; and inserting said metallic cover into said top opening of said cavity.

2. The method of claim 1 wherein said method is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

3. The method of claim 2 wherein said lead frames further comprise interconnect lines in or on the top and the bottom surface of said lead frames.

4. The method of claim 2 wherein said lead frames further provide interconnect lines in layers that are internal to the lead frames.

5. A method for mounting semiconductor devices, comprising:

providing one or more semiconductor devices, said one or more semiconductor devices having an active side having a size with semiconductor devices having been created in said active side and a backside having a size that is equal to the size of said active side whereby the plane of said backside is parallel to the plane of said active side, whereby contact bumps have been provided in the active surface of said one or more semiconductor devices;

providing a semiconductor package having a top surface in addition to having a bottom surface in addition to having side surfaces, said package being of cubic design whereby the surfaces can be extended from squares to rectangles, having Cartesian X, Y and Z coordinates with corresponding X-Y, Y-Z and Z-Y planes each plane containing two of said Cartesian coordinates, said package having been provided with a cavity having an opening, said package further having cross sections having a surface having a size in a plane that is parallel to the X-Y plane, whereby the size of the surface of said cross sections decreases for cross sections that proceed from said top surface of said package to said bottom surface of said package, said opening of said cavity having a size and being located in the plane of said top surface of said package, said cavity comprising horizontal surfaces having points of electrical contact that are parallel to the X-Y plane of the package and vertical surfaces that are parallel to the X-Z plane of the package, said package having been provided with points of electrical contact in the bottom surface of said package, said package further having been provided with conductive plugs that electrically interconnect said points of contact in said horizontal planes in said cavity with said points of electrical contact in said bottom surface of said package;

providing one or more semiconductor supports on which at least one of said one or more semiconductor devices can be mounted and that further serve as electrical insulators and heat conductors, said semiconductor supports having a top surface in addition to having a bottom surface having a size in addition to having side surfaces, said semiconductor support being of cubic design whereby the surfaces can be extended from squares to rectangles, having Cartesian X, Y and Z coordinates, said size of said bottom surface of said one or more semiconductor supports being smaller than the size of the active surface of at least one matching semiconductor device of said one or more semiconductor devices by a measurable amount;

matching at least one of said matching semiconductor devices with at least one of said one or more semiconductor supports by pairing and combining semiconductor support and semiconductor devices of about equal size in a plane that is parallel with the plane of said bottom surface of said package, creating at least one matched pair of devices and device supports said device supports having a surface having a size in the X-Y plane that is about the size of the active surface said matched semiconductor device;

inserting said at least one of said matched pair of devices and device supports into said cavity at a location in the z-direction of said package where said size of said device supports in a X-Y plane is about equal to the size of the surface of a cross section of said cavity in a plane that is parallel with the X-Y plane of Cartesian coordinates, making electrical contact between solder bumps of said semiconductor device and said points of electrical contact provided in said horizontal surfaces of said cavity, continuing said insertion in the Z direction of said package until said surfaces that are parallel with said bottom surface of said package are covered with matched pair of devices and device supports, whereby the matched pair of devices and device supports with a smallest size is inserted first;

providing a metallic cover that has a top surface having a size and a bottom surface that is parallel to the plane of said top surface having a size that is equal to said size of said top surface, whereby the size of said top surface is about equal to the size of said opening of said cavity in said semiconductor package; and inserting said metallic cover into said opening of said cavity in the top surface of said package.

6. The method of claim 5 wherein said method is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

7. The method of claim 6 wherein said lead frames further comprise interconnect lines in or on the top and the bottom surface of said lead frames.

8. The method of claim 6 wherein said lead frames further provide interconnect lines in layers that are internal to the lead frames.

9. A method for mounting semiconductor devices, comprising:

providing one or more semiconductor devices, said one or more semiconductor devices having an active side having a size with semiconductor devices having been created in said active side and a backside having a size that is equal to the size of said active side whereby the plane of said backside is parallel to the plane of said active side, whereby contact bumps have been provided in the active surface of said one or more semiconductor devices;

providing a semiconductor package having a top surface in addition to having a bottom surface in addition to having side surfaces, having Cartesian coordinates of orthogonally intersecting X, Y and Z directions, having cross sections in a plane that contains two of said Cartesian coordinates said cross sections having the shape of a geometric square or rectangle, said package having been provided with a cavity having an opening, said cavity having a cross section in a plane that is parallel to a plane containing said X and Y coordinates having the shape of a geometric square or rectangle, said cavity having a cross section in a plane that is parallel to the plane containing said Y and Z coordinates having the shape of multiple superimposed geometric squares or rectangles having a size whereby the size of each square or rectangle sequentially increases when starting at the square or rectangle that is located closest to said bottom of said package and proceeding toward the top surface of said package, whereby said superimposed and adjacent squares or rectangles are mutually aligned resulting in an overlying square or rectangle protruding from the underlying square or rectangle in equal amount around the perimeter of said underlying square or rectangle, whereby points of electrical contact are provided in said surfaces of said squares or rectangles that are not in physical contact with an underlying square or rectangle, whereby said superimposed squares or rectangles have a bottom side having a length;

providing one or more semiconductor supporting units that provide mechanical support for mounting said one or more semiconductor devices and that further function as electrical insulators and heat conductor units between said one or more semiconductor devices, said semiconductor supporting units having a top surface in addition to having a bottom surface having a size in addition to having side surfaces, said one or more supporting units having a cross section in a plane that is parallel with a plane that contains said Y and Z coordinates having the shape of a geometric square or rectangle, said cross section further having a bottom side having a length;

matching and joining at least one of said one or more semiconductor devices with at least one of said matching semiconductor support units in a plane that is parallel with the plane of said bottom surface of said package, whereby the size of the active surface of said one or more semiconductor device is about equal to the size of the surface of at least one semiconductor supporting unit, creating matched semiconductor device and device support units;

inserting said matched semiconductor device and device support units into said cavity whereby the size whereby the length of said bottom side of said superimposed squares or rectangles is about equal to the length of said bottom side of said cross section of said device supporting, overlaying said semiconductor device supporting unit with a matching semiconductor device attached thereto over said surfaces of said squares or rectangles that are not in physical contact with an underlying square or rectangle establishing electrical contact between said semiconductor devices and said points of electrical contact provided in said overlaid surfaces, establishing electrical contact between said solder bumps provided in said one or more semiconductor devices and said conductive plugs provided in the bottom surface of said semiconductor package;

providing a metallic cover that has a top surface having a size and a bottom surface that is parallel to the plane of said top surface having a size that is equal to said size of said top surface of said metallic cover, whereby the size of said top surface of said metallic cover is about equal to the size of said top opening of said cavity in said semiconductor package; and inserting said metallic cover into said top opening of said cavity.

10. The method of claim 9 wherein said method is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

11. The method of claim 9 wherein said lead frames further comprise interconnect lines in or on the top and the bottom surface of said lead frames.

12. The method of claim 9 wherein said lead frames further provide interconnect lines in layers that are internal to the lead frames.

13. A method for mounting semiconductor devices, comprising:

providing one or more semiconductor devices, said semiconductor devices having been provided with contact bumps;

providing a package for the mounting of said one or more semiconductor devices, said package having a bottom surface and a top surface in addition to having side surfaces, said package having a cavity in said top surface of said package, said package having a cross section in a plane that is perpendicular to the bottom surface of the package that shows a square or rectangular circumference of the package, said cross section further showing a cross section of the cavity in the top surface of the package, said cavity having horizontal surfaces that are parallel with said bottom surface of the package, said horizontal surfaces being located at equal distances from the side surfaces of the package and extending from said side surfaces over a limited amount without extending fully across the cavity, said horizontal surfaces being interconnected by vertical surfaces that are parallel with the side surfaces of the package, the intersect of the cavity with the top surface of the package being a vertical surface, the bottom of the cavity being a horizontal surface in close physical proximity to the bottom surface of the package, points of electrical contact having been provided in the horizontal surfaces of the cavity, said points of electrical contact are further interconnected with points of electrical contact in the bottom surface of the package, the surface of multiple cross sections of the cavity in a plane that is parallel with the bottom surface of the cavity decreasing in size for cross sections that are closer to the bottom of the package;

providing semiconductor device supports of dimensions that overlay said horizontal surfaces in said cavity of said package spanning between vertical surfaces of said cavity;

mounting said one or more semiconductor devices on a surface of said device support;

inserting said mounted devices with their support into said cavity selecting device supports that rest on said horizontal surfaces inside said cavities extending between and about meeting said vertical surfaces, establishing electrical contact between said contact bumps provided on said one or more semiconductor devices and said points of electrical contact in said horizontal surfaces inside said cavity;

providing a metallic cover for the opening of said cavity; and placing the metallic cover over said opening of said cavity.

14. The method of claim 13 wherein said method is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

15. A package for mounting semiconductor devices, comprising:

one or more semiconductor devices, said one or more semiconductor devices having an active side having a size with semiconductor devices having been created in said active side and a backside having a size that is equal to the size of said active side, whereby the plane of said backside is parallel to the plane of said active side, whereby contact bumps have been provided in the active surface of said one or more semiconductor devices;

providing a semiconductor device package having a top surface having a size, further having a bottom surface having a size that equals the size of said top surface, said top surface and said bottom surface being in parallel planes, said package having an upward direction that proceeds from said bottom surface of said package to said top surface of said package, also having a downward direction that is opposite to said upward direction, said top surface of said package and said bottom surface of said package being interconnected by four alternatingly parallel side surfaces of said package that intersect under a ninety degree angle as observed in a cross section of a plane that is parallel with said bottom surface of said package whereby said side surfaces are further perpendicular to said bottom surface of said package when observed in a cross section of said package in a plane that is perpendicular to said side surfaces, said top surface in combination with said bottom surface and said four side surfaces enclosing said package, said package having a cavity in said top surface of said package, said cavity having an opening having a size in the plane of said top surface of said package, whereby said size of said opening is smaller than said size of said top surface of said package by a measurable amount, said cavity further having contoured sidewalls, said contoured sidewalls comprising surfaces that in an alternating sequence are perpendicular to and parallel with the plane of said bottom surface starting with a surface that is perpendicular with said bottom surface of said package when entering said cavity of said package and ending with a surface that is perpendicular to said bottom surface of said package, said surfaces in said contoured sidewalls of said cavity that are parallel with said bottom having been provided with points of electrical contact, said cavity further having a flat bottom surface that is parallel to the plane of said bottom surface of said package in addition to being in close physical proximity to said bottom surface of said package, said cavity having cross sections in one or more planes that are parallel with said plane of the bottom of said package whereby multiple cross sections of said cavity in planes that are parallel with said top surface of said package have a size, whereby said size of the surface of said cross sections when proceeding from said top surface to said bottom surface of said package is of decreasing value, said cavity having a line forming a geometric center of said cavity said line being perpendicular to said bottom surface of said package and being equidistant from each pair of parallel surfaces of said sidewalls of said package, whereby a cross section of said cavity in a plane that is parallel with the plane of said bottom surface of said package is a geometric square or rectangle with points of intersection of the diagonals of said square or rectangle coinciding with the point where said line forming a geometric center of said cavity intersects the plane of the cross section, said package having been provided with points of electrical interconnect in the bottom surface of said package, said package further having conductive plugs that connect said points of electrical interconnect provided in said surfaces inside said cavity that are parallel with said bottom surface of said cavity with said points of electrical interconnect in the bottom surface of said package;

one or more semiconductor supporting units that provide mechanical support for mounting said one or more semiconductor devices and that further function as electrical insulators and heat conductor units between said one or more semiconductor devices, said one or more semiconductor supporting units having a top surface having a size and bottom surface having a size, whereby the plane of said top surface is parallel to the plane of said bottom surface, whereby therefore the size of said top surface is equal to the size of said bottom surface, whereby the size of the top surface of at least one of said one or more semiconductor supporting units can be matched with the size of an active side of at least one of said one or more semiconductor devices, whereby the size of a matching semiconductor supporting unit is smaller than the size of the top surface of a matching semiconductor device by a measurable amount;

at least one of said one or more semiconductor devices matched and joined with at least one of said semiconductor support units in a plane that is parallel with the plane of said bottom surface of said package, whereby the size of the combined surface of said one or more matched semiconductor devices is about equal to the size of at least one semiconductor supporting unit, creating matched semiconductor device and device support units;

said matched semiconductor device and device support units inserted into said cavity, whereby the size of the surface of a cross section of the cavity is about equal to said size of the surface of said one or more semiconductor device support units, overlaying said semiconductor device support unit with a matching semiconductor device attached thereto over a surface of said contoured sidewalls of said cavity that is parallel with the surface of said bottom surface of said package, establishing points of electrical contact of said solder bumps of said one or more semiconductor devices with said contact points provided in said horizontal surfaces in said cavity of said semiconductor package, establishing electrical contact between said solder bumps provided in said one or more semiconductor devices and said conductive plugs provided in the bottom surface of said semiconductor package, completing the overlaying of said surfaces inside said cavity that are parallel with said bottom surface of said package with matched semiconductor device and device support units;

a metallic cover that has a top surface having a size and a bottom surface that is parallel to the plane of said top surface having a size that is equal to said size of said top surface of said metallic cover, whereby the size of said top surface of said metallic cover is about equal to the size of said top opening of said cavity in said semiconductor package; and said metallic cover inserted into said top opening of said cavity.

16. The package of claim 15 wherein said package is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

17. The package of claim 16 wherein said lead frames further comprise interconnect lines in or on the top and the bottom surface of said lead frames.

18. The package of claim 16 wherein said lead frames further provide interconnect lines in layers that are internal to the lead frames.

19. A package for mounting semiconductor devices, comprising:

one or more semiconductor devices, said one or more semiconductor devices having an active side having a size with semiconductor devices having been created in said active side and a backside having a size that is equal to the size of said active side whereby the plane of said backside is parallel to the plane of said active side, whereby contact bumps have been provided in the active surface of said one or more semiconductor devices;

a semiconductor package having a top surface in addition to having a bottom surface in addition to having side surfaces, said package being of cubic design whereby the surfaces can be extended from squares to rectangles, having Cartesian X, Y and Z coordinates with corresponding X-Y, Y-Z and Z-Y planes each plane containing two of said Cartesian coordinates, said package having been provided with a cavity having an opening, said package further having cross sections having a surface having a size in a plane that is parallel to the X-Y plane, whereby the size of the surface of said cross sections decreases for cross sections that proceed from said top surface of said package to said bottom surface of said package, said opening of said cavity having a size and being located in the plane of said top surface of said package, said cavity comprising horizontal surfaces having points of electrical contact that are parallel to the X-Y plane of the package and vertical surfaces that are parallel to the X-Z plane of the package, said package having been provided with points of electrical contact in the bottom surface of said package, said package further having been provided with conductive plugs that electrically interconnect said points of contact in said horizontal planes in said cavity with said points of electrical contact in said bottom surface of said package;

one or more semiconductor supports on which at least one of said one or more semiconductor devices can be mounted and that further serve as electrical insulators and heat conductors, said semiconductor supports having a top surface in addition to having a bottom surface having a size in addition to having side surfaces, said semiconductor support being of cubic design whereby the surfaces can be extended from squares to rectangles, having Cartesian X, Y and Z coordinates, said size of said bottom surface of said one or more semiconductor supports being smaller than the size of the active surface of at least one matching semiconductor device of said one or more semiconductor devices by a measurable amount;

at least one of said matching semiconductor devices matched with at least one of said one or more semiconductor supports by pairing and combining semiconductor support and semiconductor devices of about equal size in a plane that is parallel with the plane of said bottom surface of said package, creating at least one matched pair of devices and device supports said device supports having a surface having a size in the X-Y plane that is about the size of the active surface said matched semiconductor device;

said at least one of said matched pair of devices and device supports inserted into said cavity at a location in the direction of said package where said size of said device supports in a X-Y plane is about equal to the size of the surface of a cross section of said cavity in a plane that is parallel with the X-Y plane of Cartesian coordinates, making electrical contact between solder bumps of said semiconductor device and said points of electrical contact provided in said horizontal surfaces of said cavity, continuing said insertion in the Z direction of said package until said surfaces that are parallel with said bottom surface of said package are covered with matched pair of devices and device supports, whereby the matched pair of devices and device supports with a smallest size is inserted first;

a metallic cover that has a top surface having a size and a bottom surface that is parallel to the plane of said top surface having a size that is equal to said size of said top surface, whereby the size of said top surface is about equal to the size of said opening of said cavity in said semiconductor package; and said metallic cover inserted into said opening of said cavity in the top surface of said package.

20. The package of claim 19 wherein said package is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

21. The package of claim 20 wherein said lead frames further comprise interconnect lines in or on the top and the bottom surface of said lead frames.

22. The package of claim 20 wherein said lead frames further provide interconnect lines in layers that are internal to the lead frames.

23. A package for mounting semiconductor devices, comprising:

one or more semiconductor devices, said one or more semiconductor devices having an active side having a size with semiconductor devices having been created in said active side and a backside having a size that is equal to the size of said active side whereby the plane of said backside is parallel to the plane of said active side, whereby contact bumps-have been provided in the active surface of said one or more semiconductor devices;

a semiconductor package having a top surface in addition to having a bottom surface in addition to having side surfaces, having Cartesian coordinates of orthogonally intersecting X, Y and Z directions, having cross sections in a plane that contains two of said Cartesian coordinates said cross sections having the shape of a geometric square or rectangle, said package having been provided with a cavity having an opening, said cavity having a cross section in a plane that is parallel to a plane containing said X and Y coordinates having the shape of a geometric square or rectangle, said cavity having a cross section in a plane that is parallel to the plane containing said Y and Z coordinates having the shape of multiple superimposed geometric squares or rectangles having a size whereby the size of each square or rectangle sequentially increases when starting at the square or rectangle that is located closest to said bottom of said package and proceeding toward the top surface of said package, whereby said superimposed and adjacent squares or rectangles are mutually aligned resulting in an overlying square or rectangle protruding from the underlying square or rectangle in equal amount around the perimeter of said underlying square or rectangle, whereby points of electrical contact are provided in said surfaces of said squares or rectangles that are not in physical contact with an underlying square or rectangle, whereby said superimposed squares or rectangles have a bottom side having a length;

providing one or more semiconductor supporting units that provide mechanical support for mounting said one or more semiconductor devices and that further function as electrical insulators and heat conductor units between said one or more semiconductor devices, said semiconductor supporting units having a top surface in addition to having a bottom surface having a size in addition to having side surfaces, said one or more supporting units having a cross section in a plane that is parallel with a plane that contains said Y and Z coordinates having the shape of a geometric square or rectangle, said cross section further having a bottom side having a length;

at least one of said one or more semiconductor devices matched and joined with at least one of said matching semiconductor support units in a plane that is parallel with the plane of said bottom surface of said package, whereby the size of the active surface of said one or more semiconductor device is about equal to the size of the surface of at least one semiconductor supporting unit, creating matched semiconductor device and device support units;

said matched semiconductor device and device support units inserted into said cavity whereby the size whereby the length of said bottom side of said superimposed squares or rectangles is about equal to the length of said bottom side of said cross section of said device supporting, overlaying said semiconductor device supporting unit with a matching semiconductor device attached thereto over said surfaces of said squares or rectangles that are not in physical contact with an underlying square or rectangle establishing electrical contact between said semiconductor devices and said points of electrical contact provided in said overlaid surfaces, establishing electrical contact between said solder bumps provided in said one or more semiconductor devices and said conductive plugs provided in the bottom surface of said semiconductor package;

a metallic cover that has a top surface having a size and a bottom surface that is parallel to the plane of said top surface having a size that is equal to said size of said top surface of said metallic cover, whereby the size of said top surface of said metallic cover is about equal to the size of said top opening of said cavity in said semiconductor package; and said metallic cover inserted into said top opening of said cavity.

24. The package of claim 23 wherein said package is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

25. The package of claim 24 wherein said lead frames further comprise interconnect lines in or on the top and the bottom surface of said lead frames.

26. The package of claim 24 wherein said lead frames further provide interconnect lines in layers that are internal to the lead frames.

27. A package for mounting semiconductor devices, comprising:

one or more semiconductor devices, said semiconductor devices having been provided with contact bumps;

a package for the mounting of said one or more semiconductor devices, said package having a bottom surface and a top surface in addition to having side surfaces, said package having a cavity in said top surface of said package, said package having a cross section in a plane that is perpendicular to the bottom surface of the package that shows a square or rectangular circumference of the package, said cross section further showing a cross section of the cavity in the top surface of the package, said cavity having horizontal surfaces that are parallel with said bottom surface of the package, said horizontal surfaces being located at equal distances from the side surfaces of the package and extending from said side surfaces over a limited amount without extending fully across the cavity, said horizontal surfaces being interconnected by vertical surfaces that are parallel with the side surfaces of the package, the intersect of the cavity with the top surface of the package being a vertical surface, the bottom of the cavity being a horizontal surface in close physical proximity to the bottom surface of the package, points of electrical contact having been provided in the horizontal surfaces of the cavity, said points of electrical contact are further interconnected with points of electrical contact in the bottom surface of the package, the surface of multiple cross sections of the cavity in a plane that is parallel with the bottom surface of the cavity decreasing in size for cross sections that are closer to the bottom of the package;

semiconductor device supports of dimensions that overlay said horizontal surfaces in said cavity of said package spanning between vertical surfaces of said cavity;

said one or more semiconductor devices mounted on a surface of said device support;

said mounted devices with their support inserted into said cavity selecting device supports that rest on said horizontal surfaces inside said cavities extending between and about meeting said vertical surfaces, establishing electrical contact between said contact bumps provided on said one or more semiconductor devices and said points of electrical contact in said horizontal surfaces inside said cavity;

a metallic cover for the opening of said cavity; and the metallic cover placed over said opening of said cavity.

28. The package of claim 27 wherein said package is further extended to include lead frames having top and bottom surfaces that are interposed between said device supports and said devices, whereby the lead frames contain one or more solder bumps in both the top and the bottom surface of said lead frames, whereby said solder bumps in the top surface of said lead frames functionally replace contact bumps in the active surface of one or more overlying devices and make electrical contact with one or more overlying semiconductor devices while solder bumps in the bottom surface of said lead frames make electrical contact with said points of electrical contact provided in said planes inside said cavity that are parallel with said bottom surface of said package, said lead frame to be provided for all semiconductor devices that are mounted inside said cavity with the exception of the semiconductor device that is mounted directly over the bottom surface of said cavity.

* * * * *